(12) United States Patent
Park et al.

(10) Patent No.: US 12,356,836 B2
(45) Date of Patent: Jul. 8, 2025

(54) DISPLAY DEVICE WITH MULTIPLE DIFFRACTION REGIONS AND METHOD OF MANUFACTURE

(71) Applicant: SAMSUNG DISPLAY CO., LTD., Yongin-si (KR)

(72) Inventors: Sangjin Park, Yongin-si (KR); Youngdae Kim, Seoul (KR); Sarah Lee, Cheonan-si (KR); Sang Jin Lee, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 720 days.

(21) Appl. No.: 17/674,962

(22) Filed: Feb. 18, 2022

(65) Prior Publication Data

US 2022/0399525 A1 Dec. 15, 2022

(30) Foreign Application Priority Data

Jun. 9, 2021 (KR) .......................... 10-2021-0074618

(51) Int. Cl.
| | |
|---|---|
| *H10K 59/80* | (2023.01) |
| *H10K 50/844* | (2023.01) |
| *H10K 50/86* | (2023.01) |
| *H10K 59/122* | (2023.01) |
| *H10K 59/40* | (2023.01) |
| *H10K 71/00* | (2023.01) |
| *H10K 102/00* | (2023.01) |

(52) U.S. Cl.
CPC ......... *H10K 59/873* (2023.02); *H10K 50/844* (2023.02); *H10K 50/865* (2023.02); *H10K 59/122* (2023.02); *H10K 59/40* (2023.02); *H10K 59/879* (2023.02); *H10K 59/8792* (2023.02); *H10K 71/00* (2023.02); *H10K 59/8731* (2023.02); *H10K 2102/00* (2023.02)

(58) Field of Classification Search
CPC .. H10K 50/844; H10K 59/873; H10K 50/865; H10K 59/8792; H10K 59/122; H10K 59/40; H10K 71/00; H10K 59/879
See application file for complete search history.

(56) References Cited

U.S. PATENT DOCUMENTS

| | | |
|---|---|---|
| 3,920,483 A | 11/1975 | Johnson, Jr. et al. |
| 10,388,913 B2 | 8/2019 | Jung et al. |

(Continued)

OTHER PUBLICATIONS

Benkherourou, et al., X-Ray Photoelectron Spectroscopy of Silicon Oxynitride Layers Obtained by Low-Energy Ion Implantation, Applied Physics A vol. 46, pp. 87-90 (1988).

(Continued)

*Primary Examiner* — Nduka E Ojeh
(74) *Attorney, Agent, or Firm* — CANTOR COLBURN LLP

(57) ABSTRACT

A display device includes: a substrate; a light emitting element disposed on the substrate; an encapsulation layer disposed on the light emitting element; an organic layer disposed on the encapsulation layer; a first light shielding layer disposed on the organic layer; and an inorganic layer disposed between the organic layer and the first light shielding layer, and including a first region overlapping the first light shielding layer in a plan view and a second region having a refractive index less than a refractive index of the first region.

21 Claims, 14 Drawing Sheets

(56) References Cited

U.S. PATENT DOCUMENTS

| | | | |
|---|---|---|---|
| 2016/0378224 A1* | 12/2016 | Kwon | H10K 59/1315 345/174 |
| 2018/0040847 A1* | 2/2018 | Lee | H10K 59/879 |
| 2018/0097204 A1* | 4/2018 | Ivan | H10K 59/8792 |
| 2019/0115404 A1* | 4/2019 | Moon | H10K 59/122 |
| 2019/0221779 A1* | 7/2019 | Jang | G06F 3/0412 |
| 2020/0161579 A1 | 5/2020 | Kim et al. | |
| 2020/0243802 A1 | 7/2020 | Ju et al. | |
| 2021/0050557 A1 | 2/2021 | Yun et al. | |

OTHER PUBLICATIONS

Extended European Search Report for Application No. 22177683. 4-1211 dated Oct. 21, 2022 enumerating the above listed references.
Shi, et al., A Review: Preparation, Performance, and Applications of Silicon Oxynitride Film, micromachines 2019, 10, 552, pp. 1-23.

* cited by examiner

FIG. 1
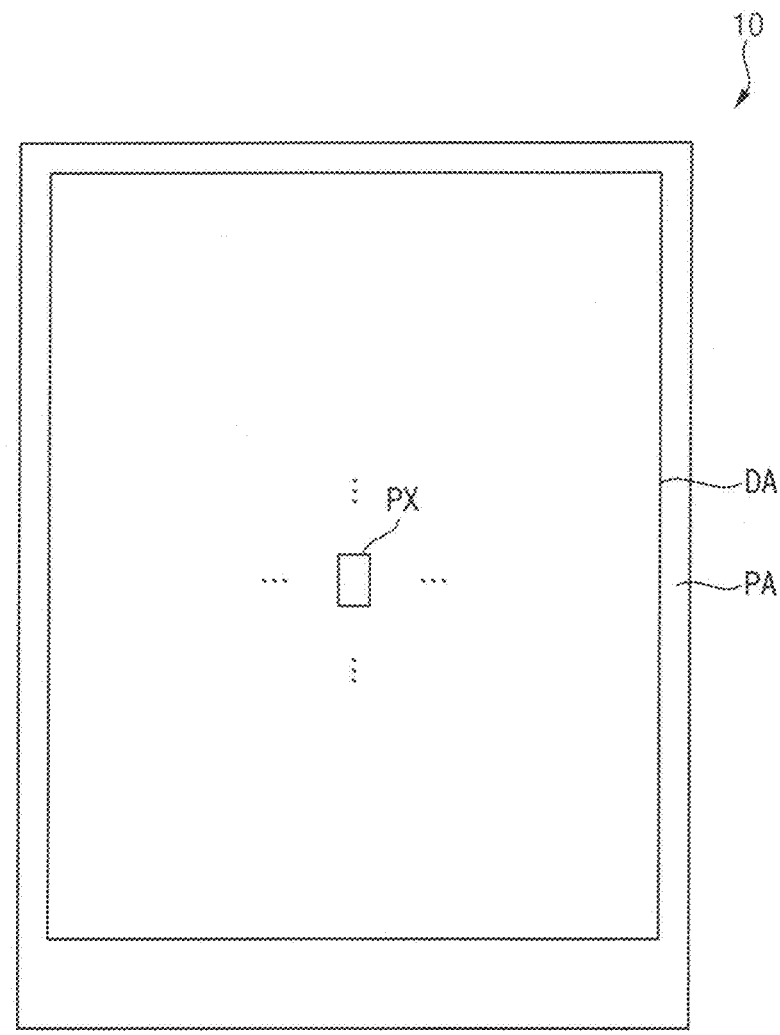
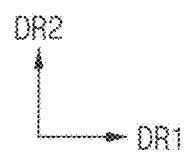

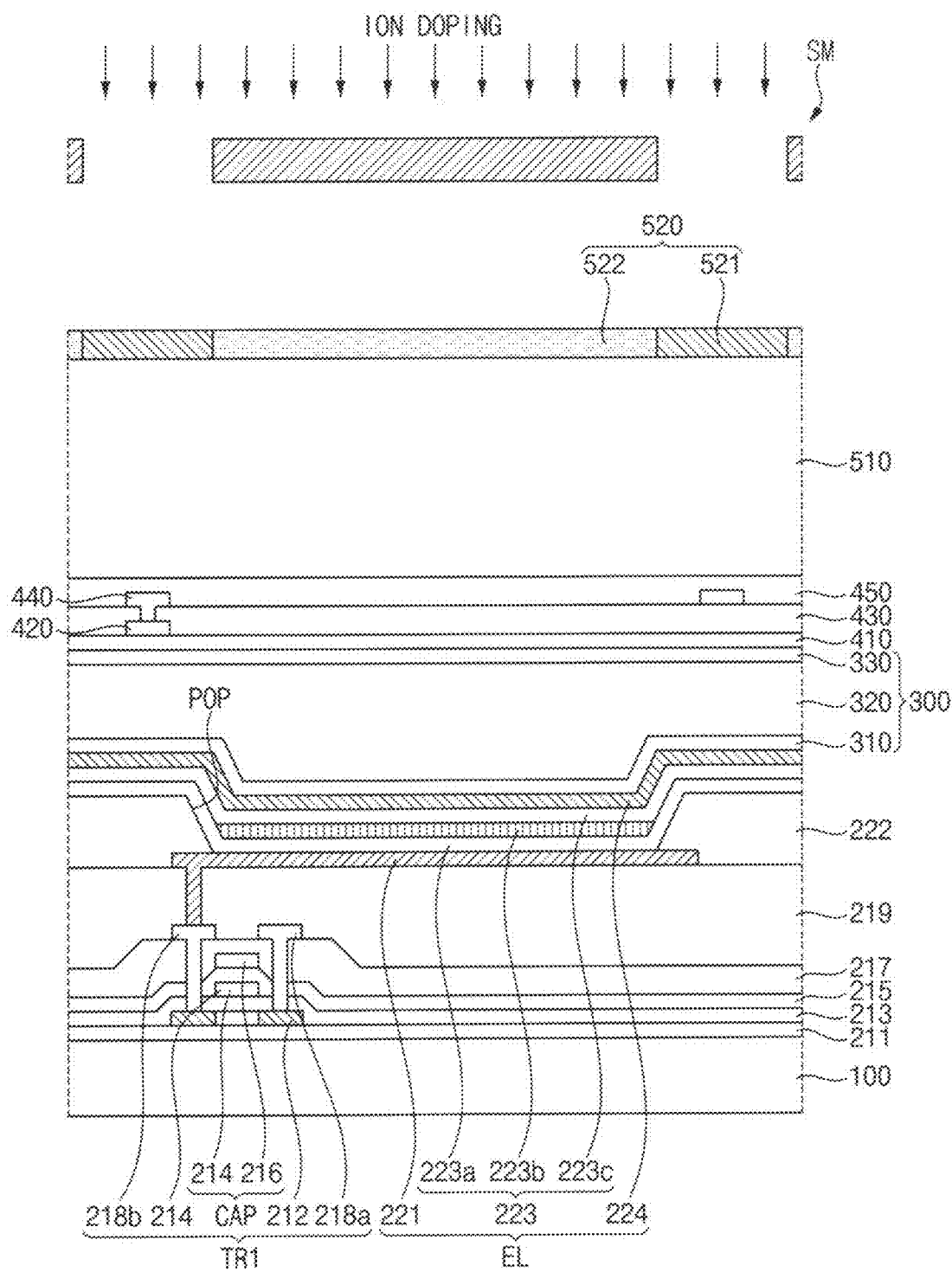

DISPLAY DEVICE WITH MULTIPLE DIFFRACTION REGIONS AND METHOD OF MANUFACTURE

This application claims priority to Korean Patent Application No. 10-2021-0074618, filed on Jun. 9, 2021, and all the benefits accruing therefrom under 35 U.S.C. § 119, the content of which in its entirety is herein incorporated by reference.

BACKGROUND

1. Field

Embodiments relate to a display device. More particularly, embodiments relate to a display device applied to an electronic apparatus and a method of manufacturing the display device.

2. Description of the Related Art

Usage of a display device has been diversified. Further, as a thickness of the display device becomes thinner and a weight of the display device becomes lighter, the range of the usage of the display device is increasing, and as the display device is utilized in various fields, the demand for the display device providing high-quality images is increasing.

A light emitting element included in the display device may emit light, and accordingly, the display device may display an image. Light emitted from the display device may travel in a direction perpendicular to a front surface of the display device, or may travel in a direction oblique to a normal direction of the front surface of the display device.

When the light emitted from the light emitting element travels in a direction oblique to the normal direction of the front surface of the display device, the light emitted from the light emitting element may reach not only a user of the display device but also others around the user. Accordingly, information provided by the display device may be shared with others.

SUMMARY

Embodiments provide a display device in which amount of light traveling in a direction oblique to the normal direction of a front surface of the display device decreases.

Embodiments provide a method of manufacturing the display device.

A display device according to an embodiment includes: a substrate; a light emitting element disposed on the substrate; an encapsulation layer disposed on the light emitting element; an organic layer disposed on the encapsulation layer; a first light shielding layer disposed on the organic layer; and an inorganic layer disposed between the organic layer and the first light shielding layer, and including a first region overlapping the first light shielding layer in a plan view and a second region having a refractive index less than a refractive index of the first region.

In an embodiment, the inorganic layer may include at least one of silicon nitride, silicon oxide, and silicon oxynitride.

In an embodiment, the number of silicon dangling bonds in the first region may be greater than the number of silicon dangling bonds in the second region.

In an embodiment, an atomic percentage of silicon in the first region may be greater than an atomic percentage of silicon in the second region.

In an embodiment, the first region may include at least one of $N^+$, $Ar^+$, $Si^+$, $P^+$, $As^+$, $Sb^+$, $O^+$, $B^+$, and $BF^{2+}$.

In an embodiment, a color of the first region may be different from a color of the second region.

In an embodiment, a width of the first region may be greater than a width of the first light shielding layer.

In an embodiment, each of the first region and the first light shielding layer may define an opening. A width of the opening of the first region may be less than a width of the opening of the first light shielding layer.

In an embodiment, a thickness of the organic layer may be greater than a thickness of the inorganic layer.

In an embodiment, the display device may further include a second light shielding layer disposed between the encapsulation layer and the organic layer and overlapping the first light shielding layer in the plan view.

In an embodiment, the display device may further include an input sensing layer disposed between the encapsulation layer and the organic layer.

In an embodiment, the light emitting element may include: a first electrode, an emission layer, and a second electrode which are sequentially stacked. The display device may further include: a pixel defining layer covering an edge of the first electrode and defining an opening exposing a center of the first electrode. The first light shielding layer may overlap the pixel defining layer in the plan view.

In an embodiment, the display device may further include a planarization layer disposed on the first light shielding layer.

A display device according to an embodiment includes: a substrate; a light emitting element disposed on the substrate; an encapsulation layer disposed on the light emitting element; an organic layer disposed on the encapsulation layer, a first light shielding layer disposed on the organic layer; and an inorganic layer disposed between the organic layer and the first light shielding layer, including a silicon compound, and including a first region and a second region. The first region overlaps the first light shielding layer in a plan view, and the number of silicon dangling bonds in the second region is less than the number of silicon dangling bonds in the first region.

In an embodiment, an atomic percentage of silicon in the first region may be greater than an atomic percentage of silicon in the second region.

In an embodiment, a refractive index of the first region may be greater than a refractive index of the second region.

In an embodiment, a width of the first region may be greater than a width of the first light shielding layer.

A method of manufacturing a display device according to an embodiment includes: forming a light emitting element on a substrate; forming an encapsulation layer on the light emitting element; forming an organic layer on the encapsulation layer; forming an inorganic layer on the organic layer; partially implanting ions into the inorganic layer to form a first region into which the ions are implanted; and forming a first light shielding layer on the inorganic layer. The first light shielding layer overlaps the first region in a plan view.

In an embodiment, partially implanting the ions into the inorganic layer may include forming a photoresist layer on the inorganic layer and implanting the ions into the inorganic layer using the photoresist layer as a doping mask.

In an embodiment, partially implanting the ions into the inorganic layer may include disposing a slit mask on the inorganic layer and implanting the ions into the inorganic layer through the slit mask.

In an embodiment, partially implanting the ions into the inorganic layer may be performed by one of an ion implantation method or an inductively coupled plasma method.

In the display device according to the embodiments, the inorganic layer disposed under the first light shielding layer may include the first region which overlaps the first light shielding layer and has a relatively high refractive index, so that amount of light traveling in a direction oblique to the normal direction of a front surface of the display device may effectively decrease.

In the method of manufacturing the display device according to the embodiments, ions may be partially implanted into the inorganic layer, so that the first region having a relatively high refractive index may be easily formed.

BRIEF DESCRIPTION OF THE DRAWINGS

Illustrative, non-limiting embodiments will be more clearly understood from the following detailed description taken in conjunction with the accompanying drawings.

FIG. 1 is a plan view illustrating a display device according to an embodiment.

FIGS. 14 and 15 are cross-sectional views illustrating a method of manufacturing a display device according to an embodiment.

DETAILED DESCRIPTION

Figure 2:
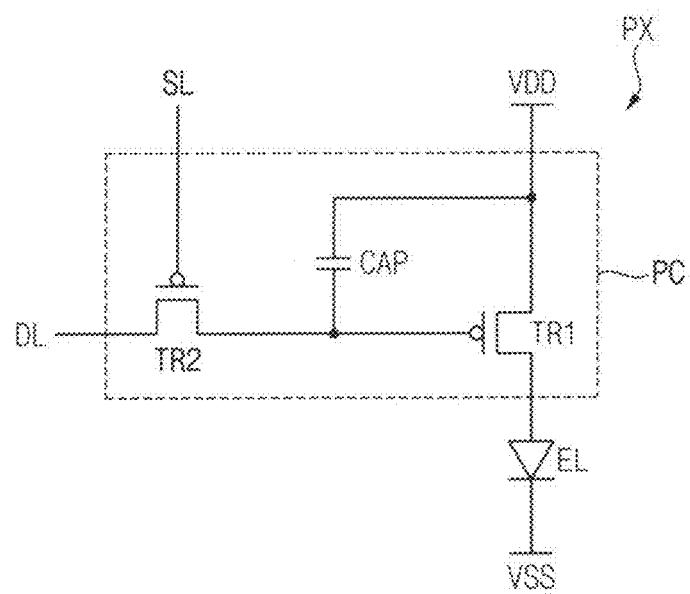
FIG. 2 is a circuit diagram illustrating a pixel included in the display device in FIG. 1.

Hereinafter, display devices and methods of manufacturing display devices in accordance with embodiments will be explained in detail with reference to the accompanying drawings. It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

A display device is a device that displays an image. The display device may include a liquid crystal display device, an electrophoretic display device, an organic light emitting display device, an inorganic light emitting display device, a field emission display device, a surface-conduction electron-emitter display device, a quantum dot display device, a plasma display device, a cathode ray display device, or the like. Hereinafter, an organic light emitting display device will be exemplarily described as a display device, however, embodiments of the present invention may be applied to the various display devices described above.

FIG. 1 is a plan view illustrating a display device 10 according to an embodiment. Here, the plan view is a view from a third direction DR3, and the third direction DR3 is a direction perpendicular to a plane defined by a first direction DR1 and a second direction DR2.

Referring to FIG. 1, a display device 10 may include a display area DA and a peripheral area PA. The display area DA may be an area providing an image.

A pixel PX may be disposed in the display area DA. In an embodiment, a plurality of pixels PX may be disposed in the display area DA. The pixels PX may be arranged in a substantially matrix form in the display area DA. The display device 10 may provide an image using light emitted from the pixels PX.

In an embodiment, the pixel PX may emit red, green, or blue light. In another embodiment, the pixel PX may emit red, green, blue, or white light. In the present specification, the pixel PX may be defined as a light emitting area emitting red, green, blue, or white light.

The peripheral area PA may be an area that does not provide an image. The peripheral area PA may surround at least a portion of the display area DA. In an embodiment, the peripheral area PA may surround the entirety of the display area DA. A driver for providing an electrical signal or voltage to the pixel PX may be disposed in the peripheral area PA.

FIG. 2 is a circuit diagram illustrating the pixel PX included in the display device 10 in FIG. 1.

Referring to FIG. 2, the pixel PX may include a pixel circuit PC and a light emitting element EL. The pixel circuit PC may provide a driving current to the light emitting element EL.

The pixel circuit PC may include a transistor and a capacitor. In an embodiment, the pixel circuit PC may include a first transistor TR1, a second transistor TR2, and a capacitor CAP. However, the present invention is not limited thereto, and in another embodiment, the pixel circuit PC may include three or more transistors and/or two or more capacitors.

A gate electrode of the first transistor TR1 may be connected to the second transistor TR2. A first electrode of the first transistor TR1 may receive a first power voltage VDD, and a second electrode of the first transistor TR1 may be connected to the light emitting element EL. The first transistor TR1 may control the driving current flowing from a first power supply providing the first power voltage VDD to the light emitting element EL based on a voltage stored in the capacitor CAP.

A gate electrode of the second transistor TR2 may be connected to a scan line SL. A first electrode of the second transistor TR2 may be connected to a data line DL, and a second electrode of the second transistor TR2 may be connected to the gate electrode of the first transistor TR1. The second transistor TR2 may provide a data signal provided from the data line DL to the first transistor TR1 in response to a scan signal provided from the scan line SL.

One of the first and second electrodes of each of the first and second transistors TR1 and TR2 may be a source electrode, and the other may be a drain electrode. In an embodiment, the first electrode and the second electrode of each of the first transistor TR1 and the second transistor TR2 may be a source electrode and a drain electrode, respectively.

A first electrode of the capacitor CAP may be connected to the second electrode of the second transistor TR2, and a second electrode of the capacitor CAP may receive the first power voltage VDD. The capacitor CAP may store a voltage corresponding to a difference between the data signal and the first power voltage VDD.

The light emitting element EL may emit light based on the driving current provided from the pixel circuit PC. A first electrode of the light emitting element EL may be connected to the pixel circuit PC, and a second electrode of the light emitting element EL may receive a second power voltage VSS. In an embodiment, a voltage level of the first power voltage VDD may be higher than a voltage level of the second power voltage VSS.

Figure 3:
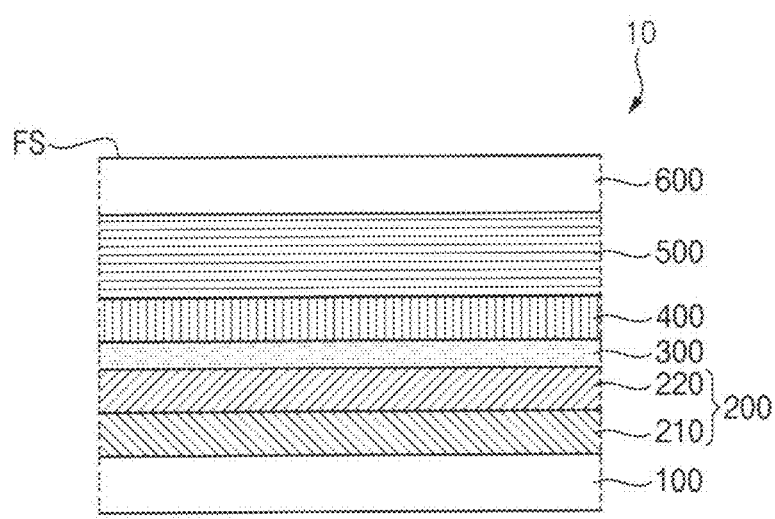
FIG. 3 is a cross-sectional view schematically illustrating a portion of the display device in FIG. 1.

FIG. 3 is a cross-sectional view schematically illustrating a portion of the display device 10 in FIG. 1.

Referring to FIG. 3, the display device 10 may include a substrate 100, a display layer 200, an encapsulation layer 300, an input sensing layer 400, an optical layer 500, and a cover window 600.

The substrate 100 may include glass, a polymer resin, or the like. For example, the polymer resin may include polyethersulfone, polyarylate, polyetherimide, polyethylene naphthalate, polyethylene terephthalate, polyphenylene sulfide, polyimide, polycarbonate, cellulose triacetate, cellulose acetate propionate, or the like. The substrate 100 including the polymer resin may have flexible, bendable, rollable, and/or foldable characteristics. In an embodiment, the substrate 100 may have a multilayer structure that includes a base layer including the polymer resin and a barrier layer including an inorganic material.

The display layer 200 may be disposed on the substrate 100. The display layer 200 may emit light toward a front surface FS of the display device 10. The display layer 200 may include a pixel circuit layer 210 and a light emitting element layer 220. The pixel circuit layer 210 may include a plurality of pixel circuits PC in FIG. 2. The light emitting element layer 220 may include a plurality of light emitting elements EL in FIG. 2.

The encapsulation layer 300 may be disposed on the display layer 200. The encapsulation layer 300 may protect the light emitting elements EL included in the display layer 200. In an embodiment, the encapsulation layer 300 may include at least one inorganic encapsulation layer and at least one organic encapsulation layer. The inorganic encapsulation layer may include an inorganic material such as aluminum oxide, titanium oxide, tantalum oxide, zinc oxide, silicon oxide, silicon nitride, silicon oxynitride, or the like. The organic encapsulation layer may include an organic material such as an acrylic resin, an epoxy resin, polyimide, polyethylene, or the like.

The input sensing layer 400 may be disposed on the encapsulation layer 300. The input sensing layer 400 may detect a user input (e.g., touch) inputted through the front surface FS of the display device 10. The input sensing layer 400 may sense the user input in various methods such as a resistive method, a capacitive method, or the like.

The optical layer 500 may be disposed on the input sensing layer 400. The optical layer 500 may control a direction of light emitted from the display layer 200. For example, the optical layer 500 may reduce the propagation of light emitted from the display layer 200 in a direction oblique to the normal direction of the front surface FS of the display device 10.

The cover window 600 may be disposed on the optical layer 500. The cover window 600 may protect components of the display device 10. The cover window 600 may include glass, plastic, or the like.

Figure 4:
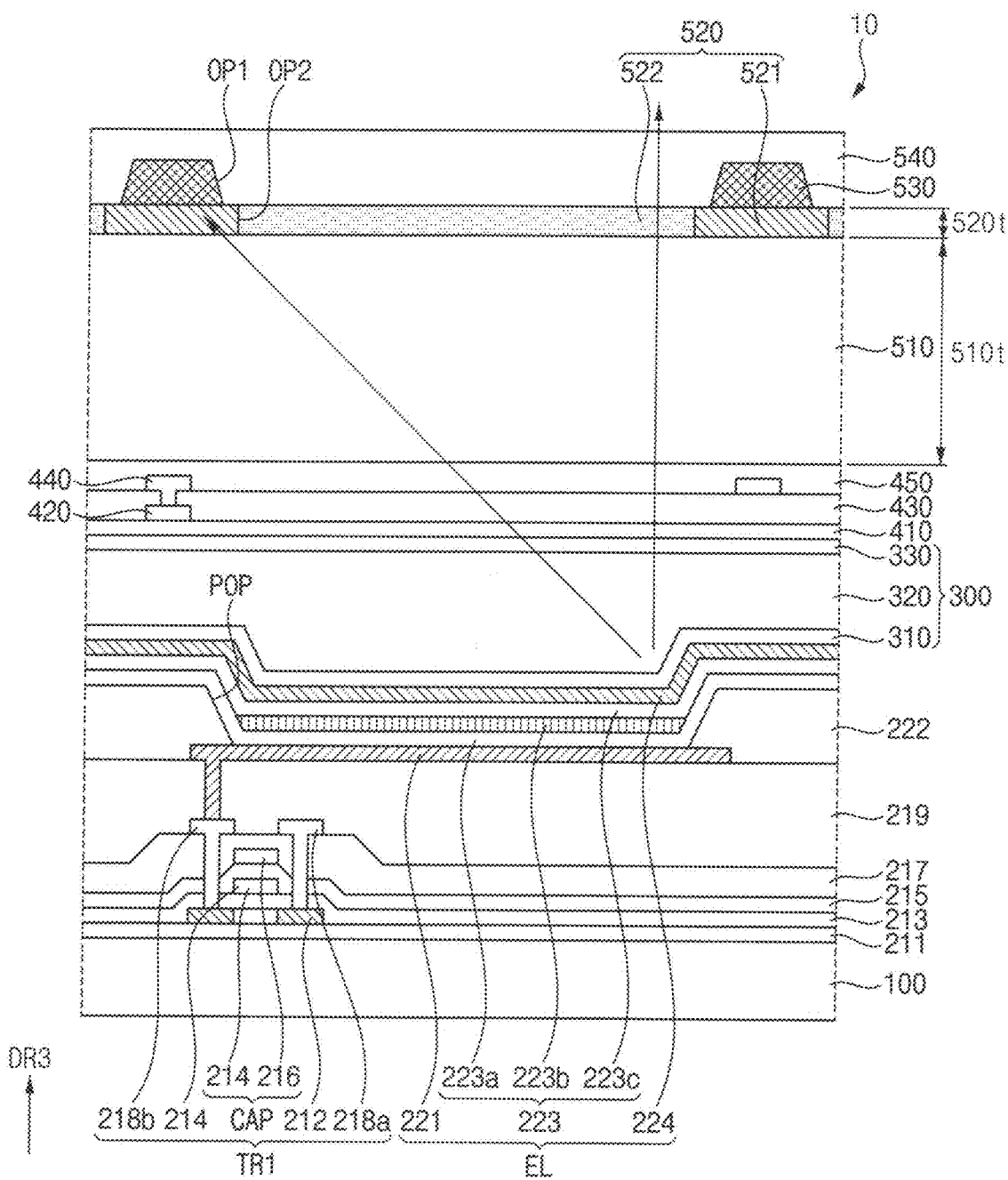
FIG. 4 is a cross-sectional view illustrating a portion of the display device in FIG. 1 in detail.

FIG. 4 is a cross-sectional view illustrating a portion of the display device 10 in FIG. 1 in detail.

Referring to FIGS. 3 and 4, the display device 10 may include the substrate 100, the display layer 200, the encapsulation layer 300, the input sensing layer 400, and the optical layer 500. The display layer 200 may include the pixel circuit layer 210 and the light emitting element layer 220.

The pixel circuit layer 210 may be disposed on the substrate 100. The pixel circuit layer 210 may include a buffer layer 211, an active layer 212, a first insulating layer 213, a gate electrode 214, a second insulating layer 215, a capacitor electrode 216, a third insulating layer 217, a source electrode 218a, a drain electrode 218b, and a fourth insulating layer 219.

The buffer layer 211 may be disposed on the substrate 100. The buffer layer 211 may provide a flat surface on the substrate 100. The buffer layer 211 may block impurities from flowing into the active layer 212. The buffer layer 211 may include an inorganic material such as silicon nitride, silicon oxide, silicon oxynitride, or the like. The buffer layer 211 may have a single-layer structure or a multilayer structure.

The active layer 212 may be disposed on the buffer layer 211. In an embodiment, the active layer 212 may include amorphous silicon, polycrystalline silicon, or the like. In another embodiment, the active layer 212 may include an oxide semiconductor. The active layer 212 may include a channel region, and a source region and a drain region disposed on opposite sides of the channel region, respectively.

The first insulating layer 213 may be disposed on the active layer 212. The first insulating layer 213 may cover the active layer 212 and be disposed on the buffer layer 211. The first insulating layer 213 may insulate the gate electrode 214 from the active layer 212. The first insulating layer 213 may include an inorganic material such as silicon nitride, silicon oxide, silicon oxynitride, or the like. The first insulating layer 213 may have a single-layer structure or a multilayer structure.

The gate electrode 214 may be disposed on the first insulating layer 213. The gate electrode 214 may overlap the channel region of the active layer 212 in a plan view. The gate electrode 214 may include a conductive material such as molybdenum (Mo), aluminum (Al), copper (Cu), titanium (Ti), or the like. The gate electrode 214 may have a single-layer structure or a multilayer structure.

The second insulating layer 215 may be disposed on the gate electrode 214. The second insulating layer 215 may cover the gate electrode 214 and be disposed on the first insulating layer 213. The second insulating layer 215 may insulate the capacitor electrode 216 from the gate electrode 214. The second insulating layer 215 may include an inorganic material such as silicon nitride, silicon oxide, silicon oxynitride, or the like. The second insulating layer 215 may have a single-layer structure or a multilayer structure.

The capacitor electrode 216 may be disposed on the second insulating layer 215. The capacitor electrode 216 may overlap the gate electrode 214 in a plan view. The capacitor electrode 216 may include a conductive material such as molybdenum (Mo), aluminum (Al), copper (Cu), titanium (Ti), or the like. The capacitor electrode 216 may have a single-layer structure or a multilayer structure. The gate electrode 214 and the capacitor electrode 216 may form the capacitor CAP.

The third insulating layer 217 may be disposed on the capacitor electrode 216. The third insulating layer 217 may cover the capacitor electrode 216 and be disposed on the second insulating layer 215. The third insulating layer 217 may insulate the source electrode 218a and the drain electrode 218b from the capacitor electrode 216. The third insulating layer 217 may include an inorganic material such as silicon nitride, silicon oxide, silicon oxynitride, or the like. The third insulating layer 217 may have a single-layer structure or a multilayer structure.

The source electrode 218a and the drain electrode 218b may be disposed on the third insulating layer 217. The source electrode 218a and the drain electrode 218b may be connected to the source region and the drain region of the active layer 212, respectively. Each of the source electrode 218a and the drain electrode 218b may include a conductive material such as molybdenum (Mo), aluminum (Al), copper (Cu), titanium (Ti), or the like. Each of the source electrode 218a and the drain electrode 218b may have a single-layer structure or a multilayer structure. The active layer 212, the gate electrode 214, the source electrode 218a, and the drain electrode 218b may form the first transistor TR1.

The fourth insulating layer 219 may be disposed on the source electrode 218a and the drain electrode 218b. The fourth insulating layer 219 may cover the source electrode 218a and the drain electrode 218b and be disposed on the third insulating layer 217. The fourth insulating layer 219 may provide a flat surface on the first transistor TR1. The fourth insulating layer 219 may include an organic material and/or an inorganic material. The fourth insulating layer 219 may have a single-layer structure or a multilayer structure.

The light emitting element layer 220 may be disposed on the pixel circuit layer 210. The light emitting element layer 220 may include a first electrode 221, a pixel defining layer 222, an intermediate layer 223, and a second electrode 224.

The first electrode 221 may be disposed on the fourth insulating layer 219. The first electrode 221 may be connected to the source electrode 218a or the drain electrode 218b. In an embodiment, the first electrode 221 may include a transmissive layer including a transparent conductive oxide such as indium tin oxide ("ITO"), indium zinc oxide ("IZO"), zinc oxide (ZnO), indium oxide (InO), indium gallium oxide ("IGO"), aluminum zinc oxide ("AZO"), or the like. In another embodiment, the first electrode 221 may include a reflective layer including a metal such as silver (Ag), magnesium (Mg), aluminum (Al), platinum (Pt), palladium (Pd), gold (Au), nickel (Ni), neodymium (Nd), iridium (Ir), chromium (Cr), or the like. In another embodiment, the first electrode 221 may include the transmissive layer and the reflective layer. For example, the first electrode 221 may have a multilayer structure of ITO/Ag/ITO.

The pixel defining layer 222 may be disposed on the first electrode 221. The pixel defining layer 222 may define a pixel opening POP exposing a center of the first electrode 221, and may cover an edge of the first electrode 221. The pixel defining layer 222 may define an emission region, and may separate the second electrode 224 from the edge of the first electrode 221. The pixel defining layer 222 may include an organic material and/or an inorganic material. The pixel defining layer 222 may have a single-layer structure or a multilayer structure.

The intermediate layer 223 may be disposed on the pixel defining layer 222. The intermediate layer 223 may include a first functional layer 223a, an emission layer 223b, and a second functional layer 223c.

The first functional layer 223a may be disposed on the pixel defining layer 222. The first functional layer 223a may include a hole injection layer ("HIL") and/or a hole transport layer ("HTL"). Alternatively, the first functional layer 223a may be omitted.

The emission layer 223b may be disposed on the first functional layer 223a. The emission layer 223b may be disposed in the pixel opening POP. The emission layer 223b may include an organic light emitting material.

In an embodiment, the organic light emitting material may include a low molecular weight organic compound or a high molecular weight organic compound. For example, the low molecular weight organic compound may include copper phthalocyanine, N,N'-diphenylbenzidine, tris-(8-hydroxyquinoline)aluminum, or the like, and the high molecular weight organic compound may include poly(3,4-ethylenedioxythiophene), polyaniline, poly-phenylenevinylene, polyfluorene, or the like.

The second functional layer 223c may be disposed on the first functional layer 223a with the emission layer 223b interposed therebetween. The second functional layer 223c may include an electron transport layer ("ETL") and/or an electron injection layer ("EIL"). Alternatively, the second functional layer 223c may be omitted.

The second electrode 224 may be disposed on the intermediate layer 223. In an embodiment, the second electrode 224 may include a transflective layer including a metal such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or the like. In another embodiment, the second electrode 224 may include the transflective layer and a transmissive layer including a transparent conductive oxide such as indium tin oxide (ITO), indium zinc oxide (IZO), zinc oxide (ZnO), indium oxide (InO), or the like. The first electrode 221, the intermediate layer 223, and the second electrode 224 may form the light emitting element EL.

The encapsulation layer 300 may be disposed on the display layer 200. In an embodiment, the encapsulation layer 300 may include a first inorganic encapsulation layer 310, an organic encapsulation layer 320, and a second inorganic encapsulation layer 330. However, the present invention is not limited thereto, and in another embodiment, the encapsulation layer 300 may include three or more inorganic encapsulation layers and/or two or more organic encapsulation layers.

The first inorganic encapsulation layer 310 may be disposed on the second electrode 224. The first inorganic encapsulation layer 310 may be disposed along the profile of the second electrode 224. The organic encapsulation layer 320 may be disposed on the first inorganic encapsulation layer 310. The organic encapsulation layer 320 may provide a flat surface on the first inorganic encapsulation layer 310. The second inorganic encapsulation layer 330 may be disposed on the organic encapsulation layer 320.

The input sensing layer 400 may be disposed on the encapsulation layer 300. The input sensing layer 400 may include a sensing buffer layer 410, a first sensing conductive layer 420, a first sensing insulating layer 430, a second sensing conductive layer 440, and a second sensing insulating layer 450.

The sensing buffer layer 410 may be disposed on the second inorganic encapsulation layer 330. The sensing buffer layer 410 may prevent damage to the encapsulation layer 300, and may block an interference signal to the input sensing layer 400. The sensing buffer layer 410 may include an inorganic material such as silicon nitride, silicon oxide, silicon oxynitride, or the like. The sensing buffer layer 410 may have a single-layer structure or a multilayer structure.

The first sensing conductive layer 420 may be disposed on the sensing buffer layer 410. The first sensing conductive layer 420 may not overlap the pixel opening POP in a plan view. The first sensing conductive layer 420 may include a metal layer or a transparent conductive layer. The metal layer may include molybdenum (Mo), aluminum (Al), copper (Cu), titanium (Ti), or the like. The transparent conductive layer may include a transparent conductive oxide such as indium tin oxide (ITO), indium zinc oxide (IZO), zinc oxide (ZnO), indium tin zinc oxide ("ITZO"), etc., a conductive polymer, metal nanowires, carbon nanotubes, graphene, or the like.

The first sensing insulating layer 430 may be disposed on the first sensing conductive layer 420. The first sensing insulating layer 430 may include an inorganic material and/or an organic material. The inorganic material may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or the like. The organic material may include an acrylic resin, a methacrylic resin, polyisoprene, a vinyl resin, an epoxy resin, a urethane resin, a cellulose resin, a perylene resin, or the like.

The second sensing conductive layer 440 may be disposed on the first sensing insulating layer 430. The second sensing conductive layer 440 may not overlap the pixel opening POP in a plan view. The second sensing conductive layer 440 may include a metal layer or a transparent conductive layer. The metal layer may include molybdenum (Mo), aluminum (Al), copper (Cu), titanium (Ti), or the like. The transparent conductive layer may include a transparent conductive oxide such as indium tin oxide (ITO), indium zinc oxide (IZO), zinc oxide (ZnO), indium tin zinc oxide (ITZO), etc., a conductive polymer, metal nanowires, carbon nanotubes, graphene, or the like. The first sensing conductive layer 420 and/or the second sensing conductive layer 440 may form sensing electrodes of the input sensing layer 400.

The second sensing insulating layer 450 may be disposed on the second sensing conductive layer 440. In an embodiment, the second sensing insulating layer 450 may include an acrylic resin, ethylhexyl acrylate, pentafluoropropyl acrylate, poly(ethylene glycol) dimethacrylate, ethylene glycol dimethacrylate, or the like. In another embodiment, the second sensing insulating layer 450 may further include a thermosetting agent such as epoxy, etc. and/or a photocuring agent.

Figure 5:
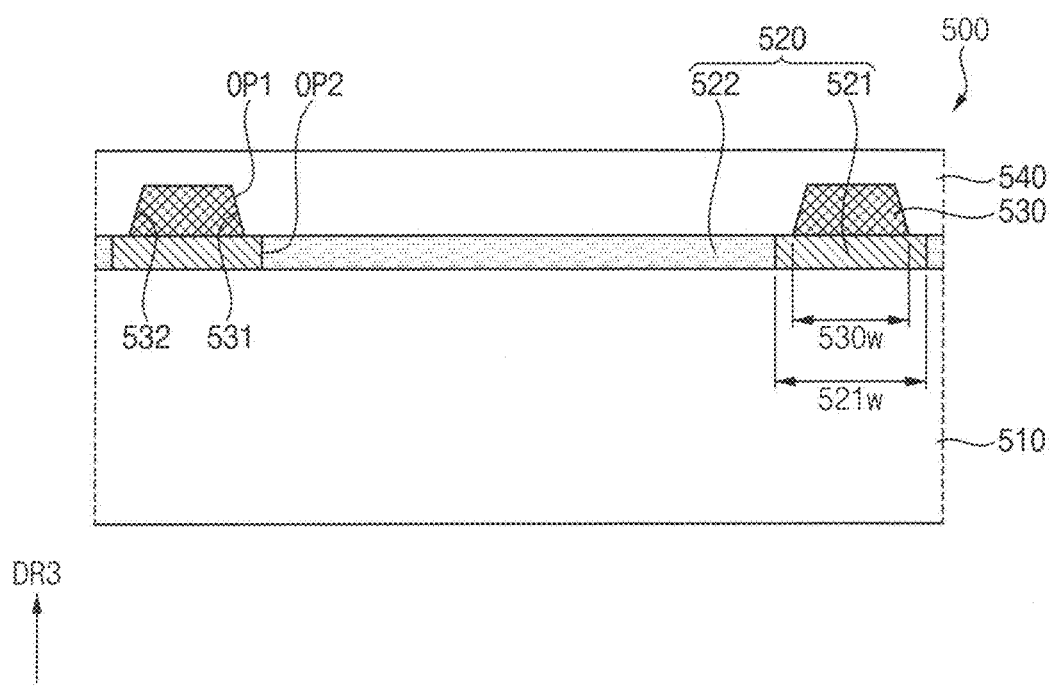
FIG. 5 is a cross-sectional view illustrating an optical layer in FIG. 4.
Figure 6:
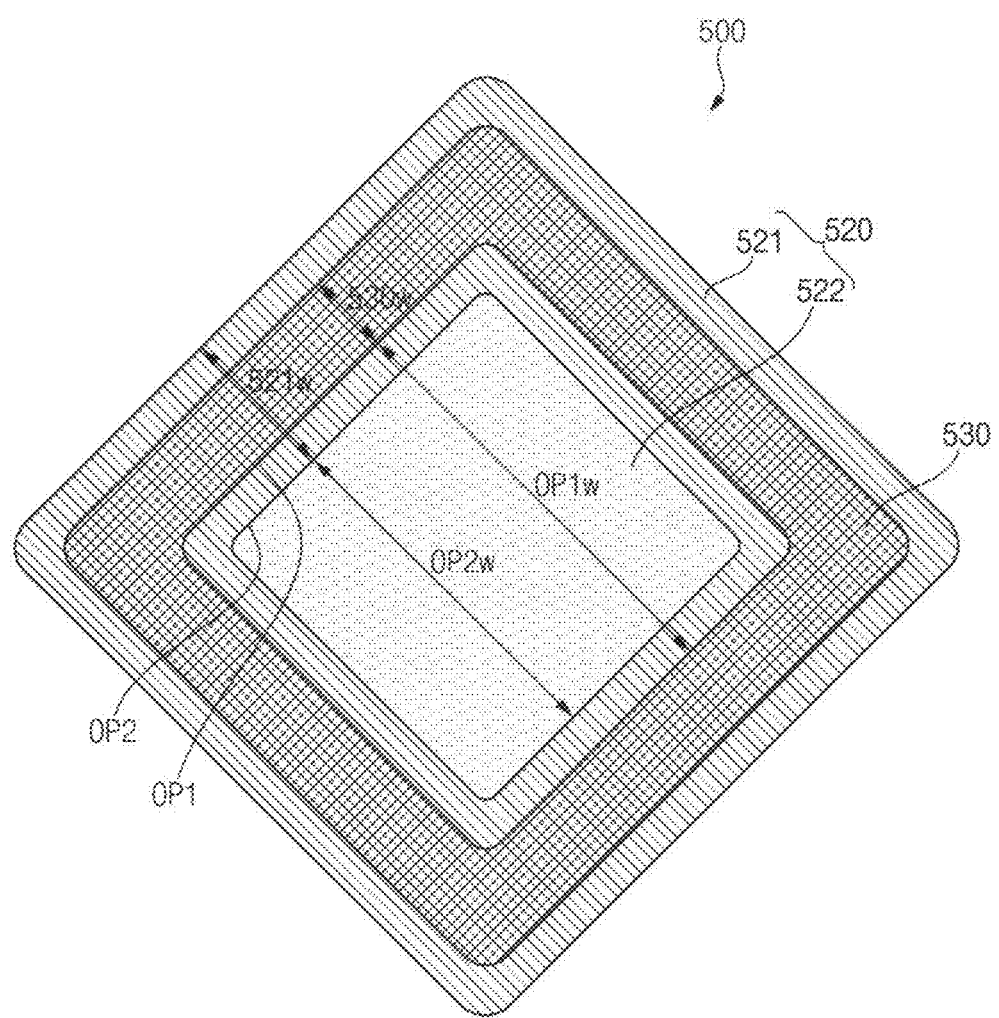
FIG. 6 is a plan view illustrating an optical layer in FIG. 4.

FIG. 5 is a cross-sectional view illustrating the optical layer 500 in FIG. 4. FIG. 6 is a plan view illustrating the optical layer 500 in FIG. 4.

Referring to FIGS. 4, 5, and 6, the optical layer 500 may be disposed on the input sensing layer 400. The optical layer 500 may include an organic layer 510, an inorganic layer 520, a first light shielding layer 530, and a planarization layer 540.

The organic layer 510 may be disposed on the second sensing insulating layer 450. In order to secure a path of light emitted from the light emitting element EL, the organic layer 510 may have a relatively large thickness 510t. A thickness 510t of the organic layer 510 may be greater than each of a thickness of the organic encapsulation layer 320 and a thickness of the second sensing insulating layer 450. The thickness 510t of the organic layer 510 may be a distance from a lower surface of the organic layer 510 to an upper surface of the organic layer 510, the thickness of the organic encapsulation layer 320 may be a distance from the lowest surface of the organic encapsulation layer 320 to an upper surface of the organic encapsulation layer 320, and the thickness of the second sensing insulating layer 450 may be a distance from a lower surface of the second sensing insulating layer 450 to an upper surface of the second sensing insulating layer 450. Here, the thickness is measured in the third direction DR3. In an embodiment, the thickness 510t of the organic layer 510 may be greater than or equal to about 20 micrometers (μm).

In an embodiment, the organic layer 510 may include an acryl-based organic material, a siloxane-based organic material, or the like. For example, the organic layer 510 may include polydiaryl siloxane, methyltrimethoxysilane, tetramethoxysilane, or the like. In another embodiment, the organic layer 510 may further include metal oxide particles such as zinc oxide (ZnO), titanium oxide (TiO), zirconium oxide (ZrO), barium titanium oxide (BaTiO), or the like.

The first light shielding layer 530 may be disposed on the organic layer 510. The first light shielding layer 530 may overlap the pixel defining layer 222 in a plan view. The first light shielding layer 530 may define a first opening OP1 therein. The first opening OP1 may overlap the pixel opening POP in a plan view. In an embodiment, the first light shielding layer 530 may have a planar quadrangular frame shape, and the first opening OP1 may have a planar quadrangular shape (See FIG. 6).

The first light shielding layer 530 may include a black pigment. The first light shielding layer 530 may absorb external light or light emitted from the light emitting element EL and traveling in a direction oblique to the normal direction of the front surface of the display device 10. The first light shielding layer 530 may be a black matrix.

The inorganic layer 520 may be disposed between the organic layer 510 and the first light shielding layer 530. The inorganic layer 520 may protect the organic layer 510.

The inorganic layer 520 may include a silicon compound. In an embodiment, the inorganic layer 520 may include at least one of silicon nitride, silicon oxide, and silicon oxynitride.

A thickness 520t of the inorganic layer 520 may be less than the thickness 510t of the organic layer 510. The thickness 520t of the inorganic layer 520 may be a distance from a lower surface of the inorganic layer 520 to an upper surface of the inorganic layer 520. In an embodiment, the thickness 520t of the inorganic layer 520 may be about 0.05 μm to about 0.5 μm.

The inorganic layer 520 may include a first region 521 and a second region 522. The first region 521 may overlap the first light shielding layer 530 in a plan view. The second region 522 may be adjacent to the first region 521, and may not overlap the first light shielding layer 530 in a plan view.

The first region 521 may define the second opening OP2 therein. In an embodiment, the first region 521 may have a planar quadrangular frame shape, and the second opening OP2 may have a planar quadrangular shape.

A width 521w of the first region 521 may be greater than a width 530w of the first light shielding layer 530. The width 521w is a width of the frame of the first region 521 as shown in FIG. 6. The width 530w of the first light shielding layer 530 may be a distance between a bottom of an inner side wall 531 of the first light shielding layer 530 defining the first opening OP1 and a bottom an outer side wall 532 of the first light shielding layer 530.

A width OP2w of the second opening OP2 may be less than a width OP1w of the first opening OP1. The width OP1w is a distance between inner side walls 531 facing each other. The width OP2w is a distance between inner sides of the first region 521 facing each other. Here, the "width" is measured in a plane defined by the first direction DR1 and the second direction DR2. The first opening OP1 may surround the second opening OP2 in a plan view. That is a size (i.e., area) of the first opening OP1 may be greater than a size of the second opening OP2 in a plan view.

The refractive index of the first region 521 may be greater than the refractive index of the second region 522. In an embodiment, the refractive index of the second region 522 may be about 1.5 to about 2.0, and the refractive index of the first region 521 may be greater than the refractive index of the second region 522.

The number of silicon dangling bonds in the first region 521 may be greater than the number of silicon dangling bonds in the second region 522. Also, an atomic percentage of silicon in the first region 521 may be greater than an atomic percentage of silicon in the second region 522. The atomic percentage of silicon in the inorganic layer 520 may mean a ratio of silicon among silicon, nitrogen, and oxygen included in the inorganic layer 520.

When the number of silicon dangling bonds in an inorganic layer including a silicon compound increases or the atomic percentage of silicon in the inorganic layer increases, the refractive index of the inorganic layer may increase. Accordingly, the refractive index of the first region 521 including a relatively large number of silicon dangling bonds or having a relatively high atomic percentage of silicon may be greater than the refractive index of the second region 522 including a relatively small number of silicon dangling bonds or having a relatively small atomic percentage of silicon.

The first region 521 may include at least one of $N^+$, $Ar^+$, $P^+$, $As^+$, $Sb^+$, $O^+$, $B^+$, and $BF^{2+}$ ions. The ions may be implanted into the first region 521, and the ions may break a bond between silicon and nitrogen and/or a bond between silicon and oxygen. Accordingly, the number of silicon dangling bonds in the first region 521 may increase, and the atomic percentage of silicon in the first region 521 may increase.

A color of the first region 521 may be different from a color of the second region 522. Since the refractive index of the first region 521 and the refractive index of the second region 522 are different, the color of the first region 521 may be viewed differently from the color of the second region 522.

The planarization layer 540 may be disposed on the first light shielding layer 530. The planarization layer 540 may cover the first light shielding layer 530 and be disposed on the inorganic layer 520. The planarization layer 540 may provide a flat surface on the first light shielding layer 530. The planarization layer 540 may include acryl, benzocyclobetene ("BCB"), hexamethyldisiloxane ("HMDSO"), or the like.

Figure 7:
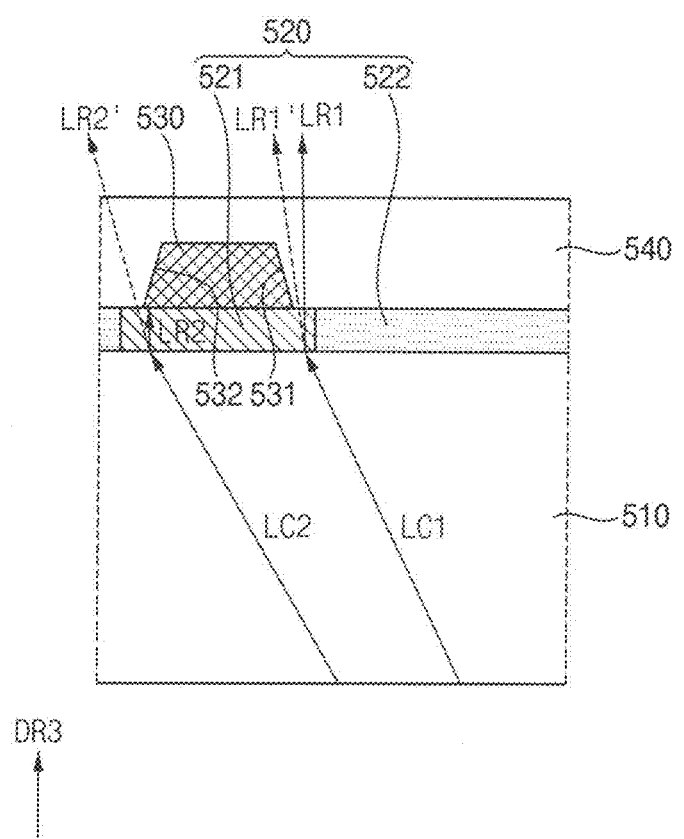
FIG. 7 is a diagram for describing refraction of light by a first region of an inorganic layer.

FIG. 7 is a diagram for describing refraction of light by the first region 521 of the inorganic layer 520.

Referring to FIGS. 4 and 7, the first region 521 of the inorganic layer 520 may refract light emitted from the light emitting element EL and traveling in a direction oblique to the normal direction of the front surface of the display device 10.

When a first incident light LC1 traveling in a direction oblique to the normal direction (i.e., the third direction DR3) of the front surface of the display device 10 is incident into a portion of the first region 521 of the inorganic layer 520 adjacent to the inner side wall 531 of the first light shielding layer 530, a refraction angle of a first refracted light LR1 refracted by the first region 521 of the inorganic layer 520 with respect to the third direction DR3 may be less than a refraction angle of a first refracted light LR1' refracted by an inorganic layer 520 that does not include the first region 521. That is, the refraction angle of the first refracted light LR1 refracted by the first region 521 of the inorganic layer 520 may be less than a refraction angle of a refracted light refracted by the second region 522 of the inorganic layer 520 with respect to the normal direction of the front surface of the display device 10. Accordingly, the first refracted light LR1 may travel in a direction closer to the normal direction (i.e., perpendicular direction) of the front surface of the display device 10 than the first refracted light LR1', and light traveling in a direction perpendicular to the front surface of the display device 10 may increase due to the first region 521 of the inorganic layer 520.

When a second incident light LC2 traveling in a direction oblique to the normal direction of the front surface of the display device 10 is incident into a portion of the first region 521 of the inorganic layer 520 adjacent to the outer side wall 532 of the first light shielding layer 530, a refraction angle of a second refracted light LR2 refracted by the first region 521 of the inorganic layer 520 with respect to the third direction DR3 may be less than a refraction angle of a second refracted light LR2' refracted by an inorganic layer 520 that does not include the first region 521. That is, the refraction angle of the second refracted light LR2 refracted by the first region 521 of the inorganic layer 520 may be less than a refraction angle of a refracted light refracted by the second region 522 of the inorganic layer 520 with respect to the normal direction of the front surface of the display device 10. Accordingly, the second refracted light LR2 may be absorbed by the first light shielding layer 530, and amount of light traveling in a direction oblique to the direction perpendicular to the front surface of the display device 10 may decrease due to the first region 521 of the inorganic layer 520.

In a display device according to the prior art, light emitted from a light emitting element may travel in a direction oblique to the normal direction of a front surface of the display device, and the light emitted from the light emitting element may be reached not only to a user using the display device but also to others around the user. Accordingly, information provided by the display device may be shared with others, and it is hard to secure privacy.

However, in the display device 10 according to the embodiments of the present invention, the first light shielding layer 530 may absorb light emitted from the light emitting element EL and traveling in a direction oblique to the normal direction of the front surface of the display device 10. Further, as the first region 521 of the inorganic layer 520 refracts light emitted from the light emitting element EL and traveling in a direction oblique to the normal direction of the front surface of the display device 10, light traveling in a direction perpendicular to the front surface of the display device 10 may increase, and amount of light traveling in a direction oblique to the normal direction of the front surface of the display device 10 may effectively decrease. Accordingly, information provided by the display device 10 may not be shared with others.

Figure 8:
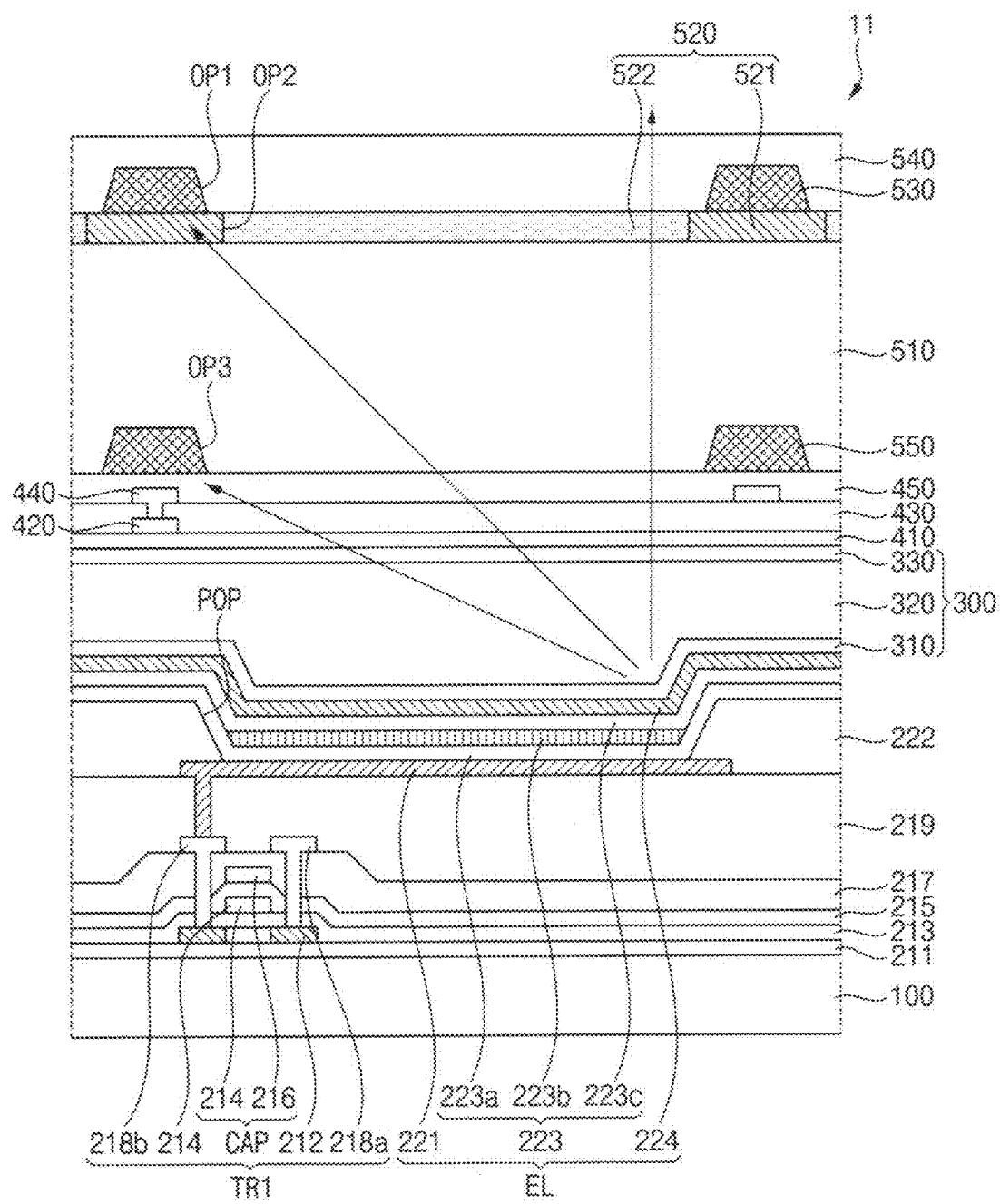
FIG. 8 is a cross-sectional view illustrating a portion of a display device according to an embodiment in detail.

FIG. 8 is a cross-sectional view illustrating a portion of a display device 11 according to an embodiment in detail.

The display device 11 described with reference to FIG. 8 may be substantially the same as or similar to the display device 10 described with reference to FIG. 4, except for further including a second light shielding layer 550. Accordingly, descriptions of the overlapping components will be omitted.

Referring to FIG. 8, an optical layer 500 may include an organic layer 510, an inorganic layer 520, a first light shielding layer 530, a planarization layer 540, and a second light shielding layer 550.

The second light shielding layer 550 may be disposed between the second sensing insulating layer 450 and the organic layer 510. The second light shielding layer 550 may overlap the first light shielding layer 530 in a plan view. The second light shielding layer 550 may define a third opening OP3. The third opening OP3 may overlap the first opening OP1 in a plan view.

The second light shielding layer 550 may include a black pigment. The second light shielding layer 550 may absorb external light or light emitted from the light emitting element EL and traveling in a direction oblique to the normal direction of the front surface of the display device 10. The second light shielding layer 550 may be a black matrix.

As the optical layer 500 further includes the second light shielding layer 550 as well as the first light shielding layer 530, amount of light emitted from the light emitting element EL and traveling in a direction oblique to the normal direction of the front surface of the display device 10 may further decrease.

FIGS. 9, 10, 11, 12, and 13 are cross-sectional views illustrating a method of manufacturing a display device according to an embodiment. FIGS. 9 to 13 may illustrate an example of a method of manufacturing the display device 10 illustrated in FIG. 4.

Figure 9:
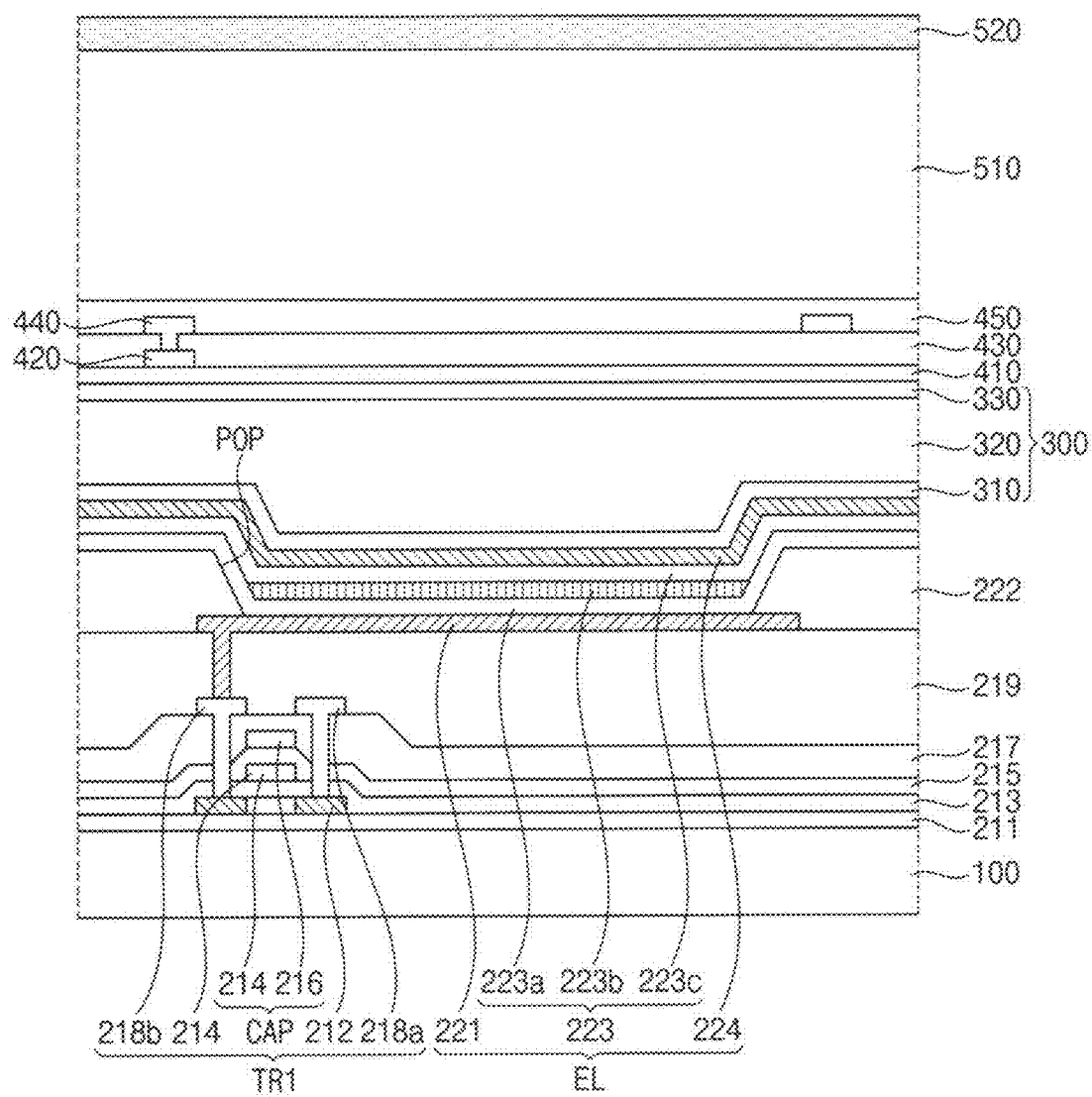
FIGS. 9, 10, 11, 12, and 13 are cross-sectional views illustrating a method of manufacturing a display device according to an embodiment.

Referring to FIG. 9, the light emitting element EL, the encapsulation layer 300, the organic layer 510, and the inorganic layer 520 may be sequentially formed on the substrate 100.

First, the buffer layer 211, the active layer 212, the first insulating layer 213, the gate electrode 214, the second insulating layer 215, the capacitor electrode 216, the third insulating layer 217, the source and drain electrodes 218a and 218b, and the fourth insulating layer 219 may be sequentially formed on the substrate 100 to form the pixel circuit layer 210 in FIG. 3. Then, the first electrode 221, the pixel defining layer 222, the first functional layer 223a, the emission layer 223b, the second functional layer 223c, and the second electrode 224 may be sequentially formed on the fourth insulating layer 219 to form the light emitting element layer 220 in FIG. 3.

Then, the encapsulation layer 300 may be formed by sequentially forming the first inorganic encapsulation layer 310, the organic encapsulation layer 320, and the second inorganic encapsulation layer 330 on the second electrode 224. Then, the sensing buffer layer 410, the first sensing conductive layer 420, the first sensing insulating layer 430, the second sensing conductive layer 440, and the second sensing insulating layer 450 may be sequentially formed on the second inorganic encapsulation layer 330 to form the input sensing layer 400 in FIG. 3.

Then, the organic layer 510 may be formed on the second sensing insulating layer 450. In an embodiment, the organic layer 510 may be formed by an inkjet printing method. For example, the organic layer 510 may be formed by discharging ink including an organic material on the second sensing insulating layer 450. In another embodiment, the organic layer 510 may be formed by an evaporation method.

Then, the inorganic layer 520 may be formed on the organic layer 510. The thickness of the inorganic layer 520 may be less than the thickness of the organic layer 510. The inorganic layer 520 may be formed of at least one of silicon nitride, silicon oxide, and silicon oxynitride.

In an embodiment, the inorganic layer 520 may be formed by chemical vapor deposition ("CVD"). In another embodiment, the inorganic layer 520 may be formed by physical vapor deposition ("PVD"). In another embodiment, the inorganic layer 520 may be formed by atomic layer deposition ("ALD").

Figure 10:
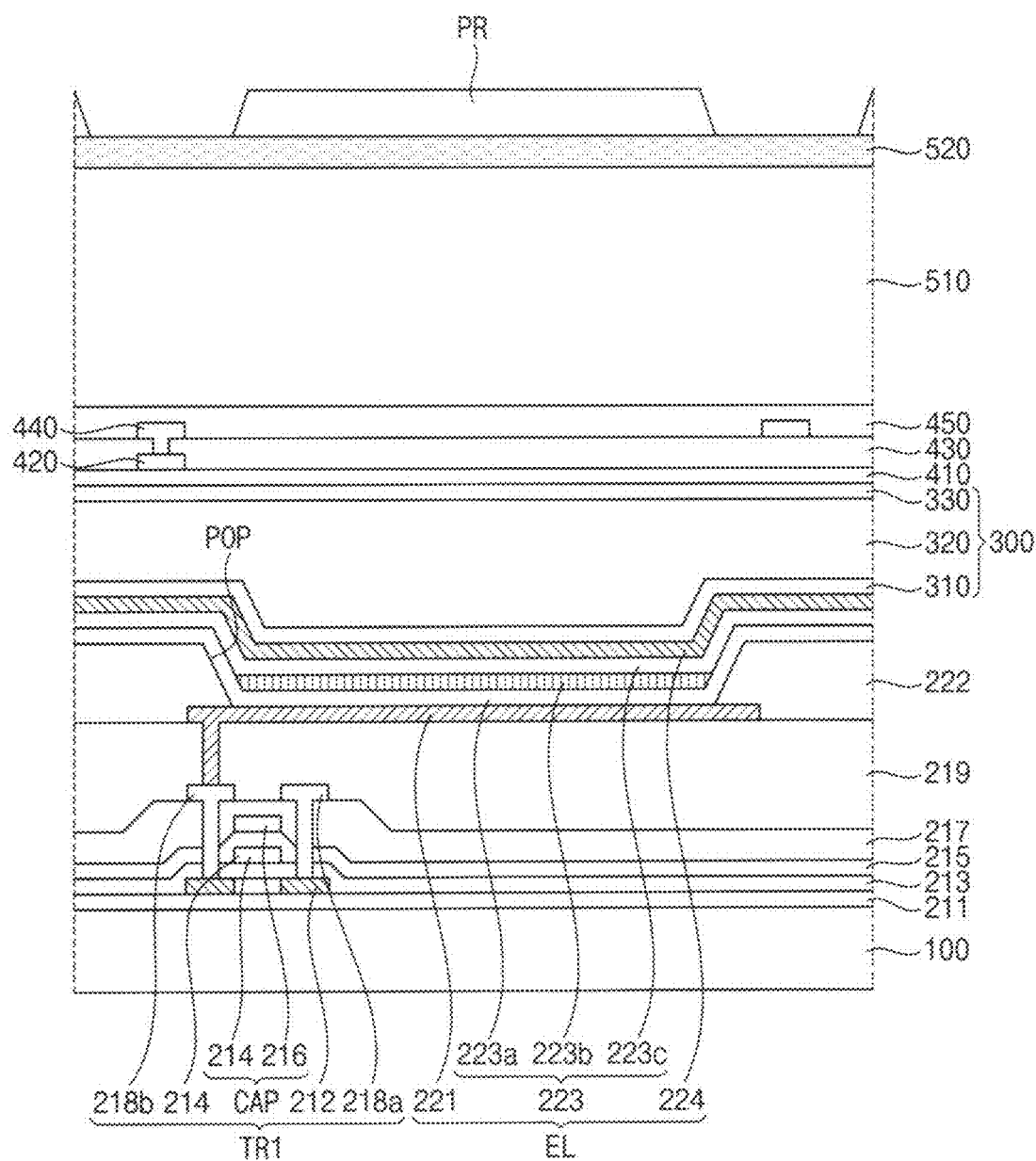
Figure 11:
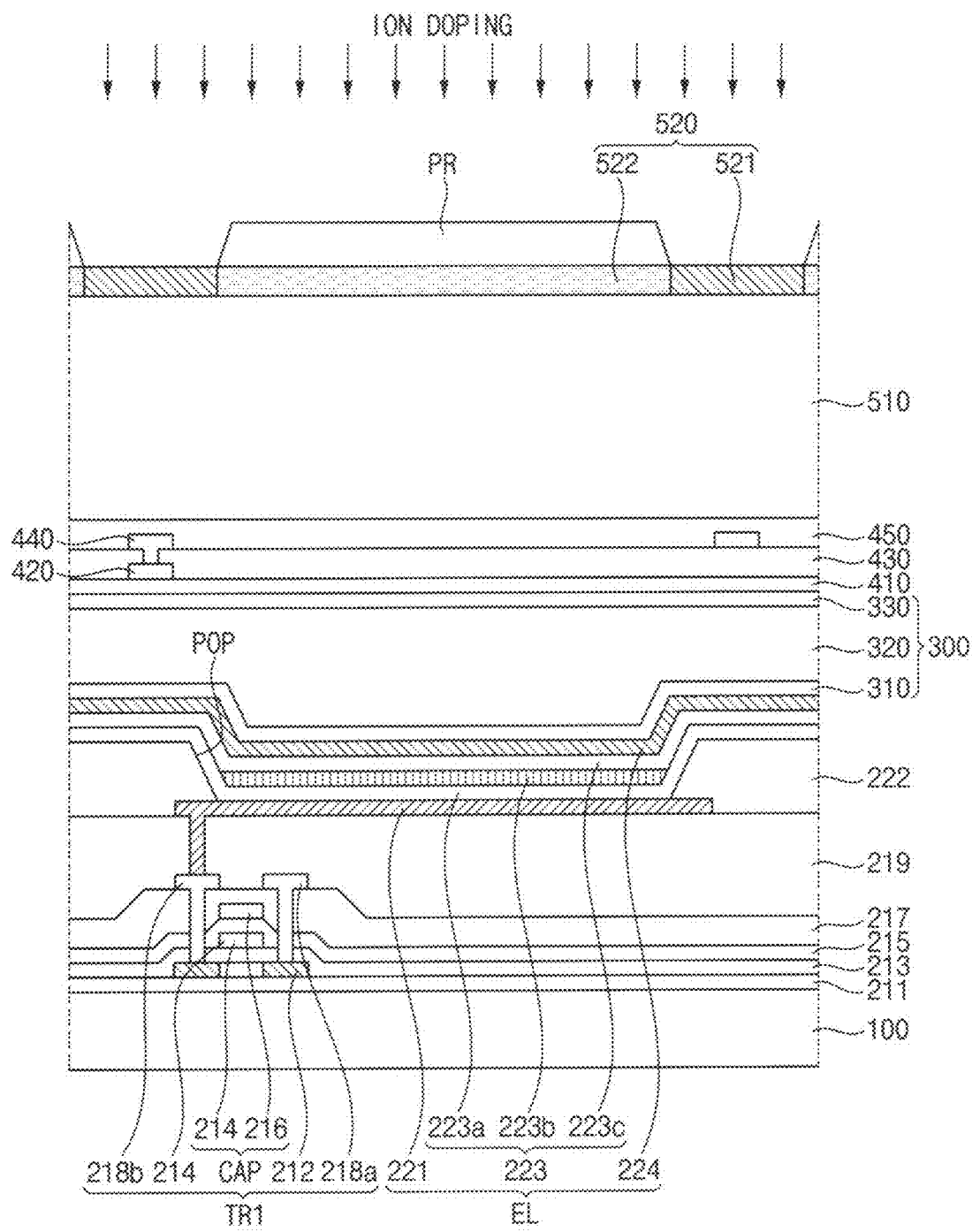

Referring to FIGS. 10 and 11, ions may be partially implanted into the inorganic layer 520 to form the first region 521 into which the ions are implanted.

In an embodiment, the ions may include at least one of $N^+$, $Ar^+$, $P^+$, $As^+$, $Sb^+$, $O^+$, $B^+$, and $BF^{2+}$. In an embodiment, the partial implantation of the ions may be performed by one of an ion implantation method and an inductively coupled plasma ("ICP") method.

In an embodiment, the ions may be partially implanted into the inorganic layer 520 using a photoresist layer PR. First, as shown in FIG. 10, the photoresist layer PR may be formed on the inorganic layer 520. Then, as shown in FIG. 11, the ions may be implanted into the inorganic layer 520 using the photoresist layer PR as a doping mask. The photoresist layer PR may be formed to overlap the second region 522 of the inorganic layer 520 in a plan view, and may define an opening overlapping the first region 521 of the inorganic layer 520. The ions may be implanted into the inorganic layer 520 through the opening to form the first region 521.

The number of silicon dangling bonds in the first region 521 may increase, and the atomic percentage of silicon in the first region 521 may increase by the implantation of the ions. Accordingly, the number of silicon dangling bonds in the first region 521 may be greater than the number of silicon dangling bonds in the second region 522, and the atomic percentage of silicon in the first region 521 may be greater than the atomic percentage of silicon in the second region 522 after the implantation of the ions. Since a refractive index of an inorganic layer increases when the number of silicon dangling bonds in the inorganic layer including a silicon compound increases or the atomic percentage of silicon in the inorganic layer increases, the refractive index of the first region 521 may increase by the implantation of the ions. Accordingly, the refractive index of the first region 521 may be greater than the refractive index of the second region 522.

Figure 12:
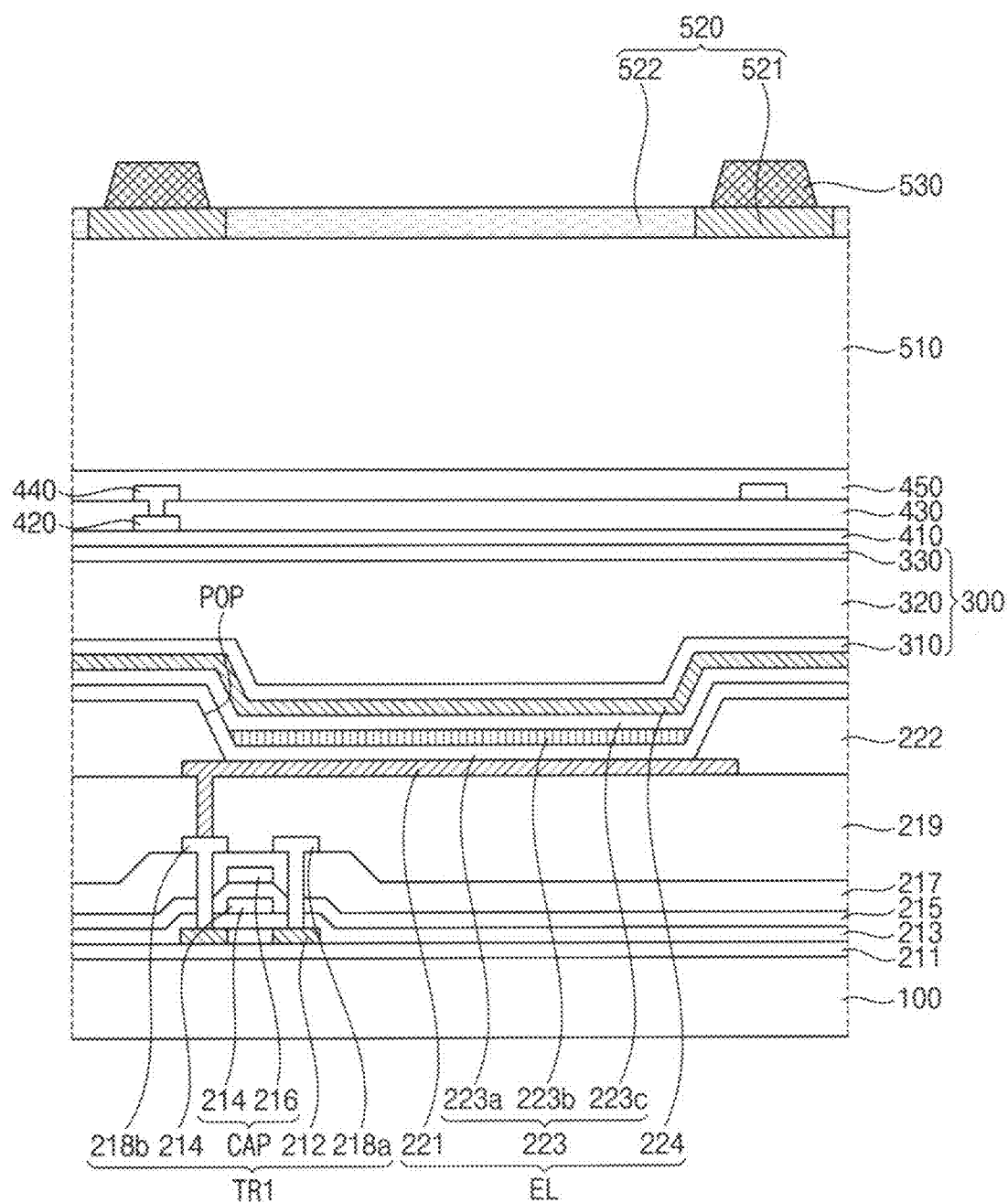

Referring to FIG. 12, the first light shielding layer 530 may be formed on the inorganic layer 520. The first light shielding layer 530 may overlap the first region 521 of the inorganic layer 520 in a plan view. In an embodiment, the first light shielding layer 530 may be formed by coating a photoresist on the inorganic layer 520 and exposing and developing the photoresist using photolithography.

Figure 13:
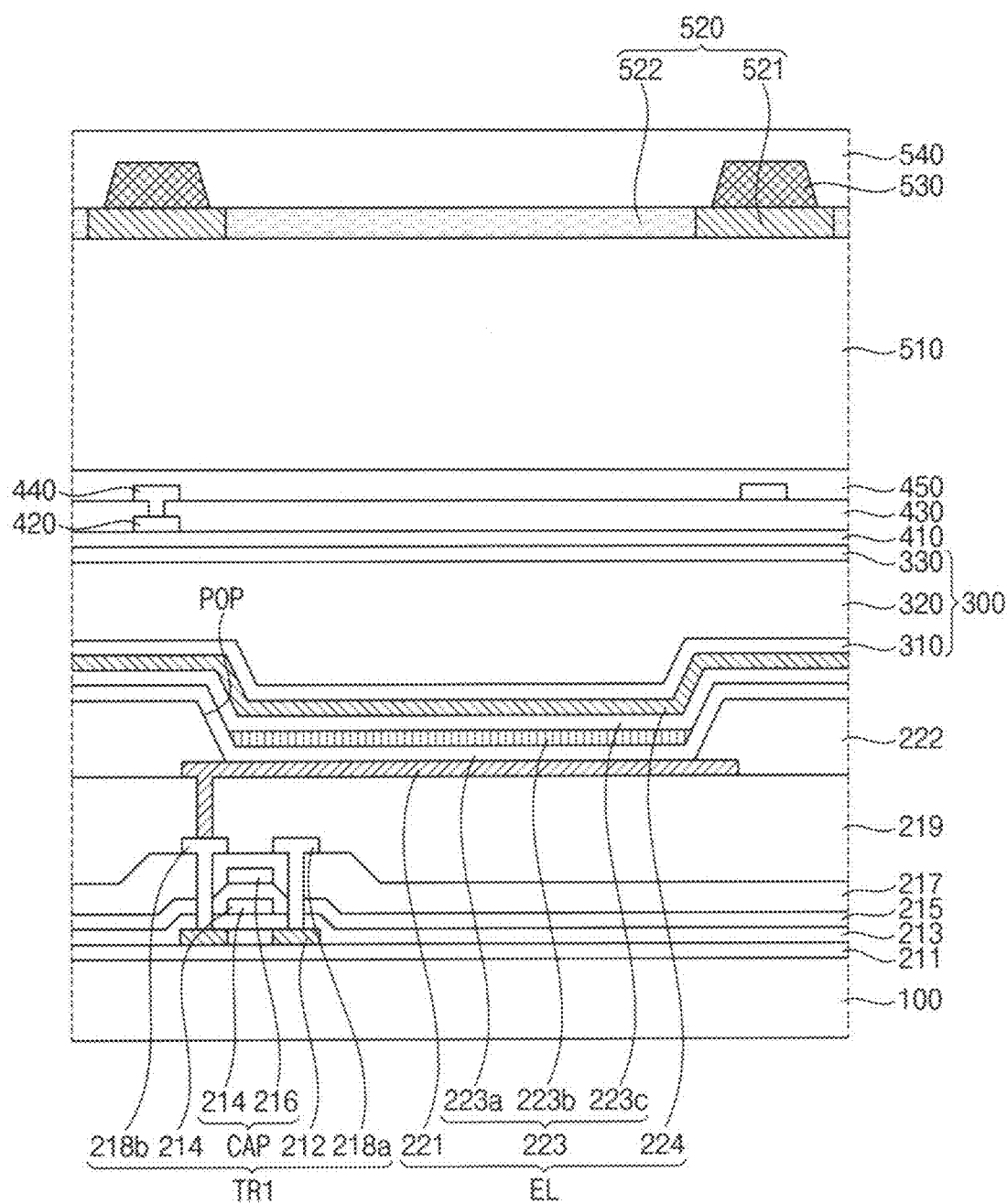

Referring to FIG. 13, the planarization layer 540 may be formed on the first light shielding layer 530. The planarization layer 540 may be formed on the inorganic layer 520 to cover the first light shielding layer 530.

Figure 14:
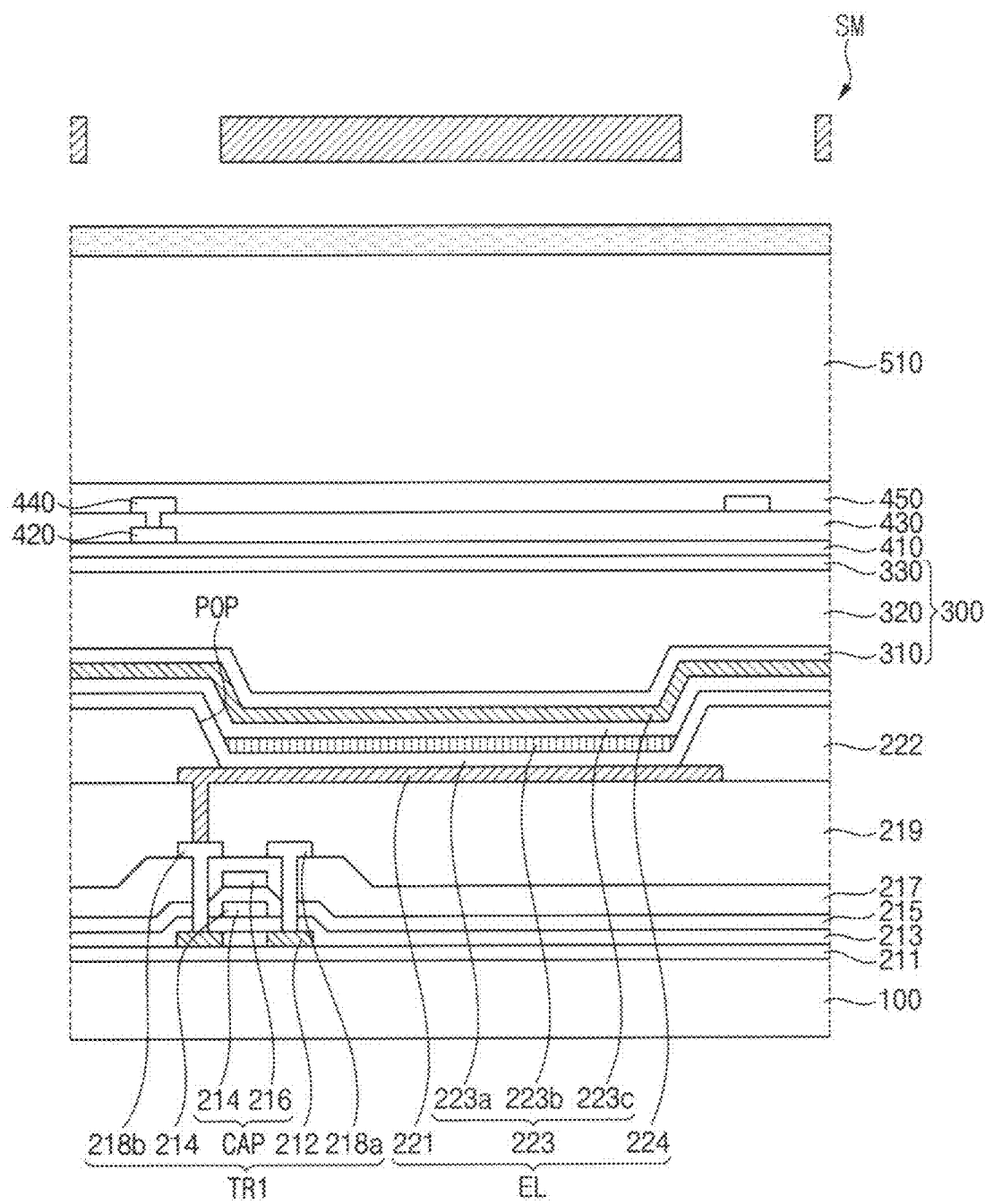

FIGS. 14 and 15 are cross-sectional views illustrating a method of manufacturing a display device according to an embodiment. FIGS. 14 and 15 may illustrate another example of a method of manufacturing the display device 10 illustrated in FIG. 4.

The method of manufacturing the display device described with reference to FIGS. 14 and 15 may be substantially the same as or similar to the method of manufacturing the display device described with reference to FIGS. 9 to 13, except for partial implantation of ions. Accordingly, descriptions of the overlapping components will be omitted.

Referring to FIGS. 14 and 15, ions may be partially implanted into the inorganic layer 520 to form the first region 521 into which the ions are implanted.

In an embodiment, the ions may be partially implanted into the inorganic layer 520 using a slit mask SM. First, as shown in FIG. 14, the slit mask SM may be disposed on the inorganic layer 520. Then, as shown in FIG. 15, the ions may be implanted into the inorganic layer 520 through the slit mask SM. The slit mask SM may define an opening overlapping the first region 521 of the inorganic layer 520 in a plan view, and the ions may be implanted into the inorganic layer 520 through the opening to form the first region 521.

The display device according to the embodiments may be applied to a display device included in a computer, a notebook, a mobile phone, a smart phone, a smart pad, a PMP, a PDA, an MP3 player, or the like.

Although the display devices and the methods of manufacturing the display devices according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device, comprising:
a substrate;
a light emitting element disposed on the substrate;
an encapsulation layer disposed on the light emitting element;
an organic layer disposed on the encapsulation layer;
a first light shielding layer disposed on the organic layer; and
an inorganic layer disposed between the organic layer and the first light shielding layer, and including a first region overlapping the first light shielding layer in a plan view and a second region having a refractive index less than a refractive index of the first region, the first region and the second region being coplanar.

2. The display device of claim 1, wherein the inorganic layer includes at least one of silicon nitride, silicon oxide, and silicon oxynitride.

3. The display device of claim 2, wherein a number of silicon dangling bonds in the first region is greater than a number of silicon dangling bonds in the second region.

4. The display device of claim 2, wherein an atomic percentage of silicon in the first region is greater than an atomic percentage of silicon in the second region.

5. The display device of claim 1, wherein the first region includes at least one of $N^+$, $Ar^+$, $Si^+$, $P^+$, $As^+$, $Sb^+$, $O^+$, $B^+$, and $BF^{2+}$.

6. The display device of claim 1, wherein a color of the first region is different from a color of the second region.

7. The display device of claim 1, wherein a width of the first region is greater than a width of the first light shielding layer.

8. The display device of claim 1, wherein each of the first region and the first light shielding layer defines an opening, and
wherein a width of the opening of the first region is less than a width of the opening of the first light shielding layer.

9. The display device of claim 1, wherein a thickness of the organic layer is greater than a thickness of the inorganic layer.

10. The display device of claim 1, further comprising:
a second light shielding layer disposed between the encapsulation layer and the organic layer, and overlapping the first light shielding layer in the plan view.

11. The display device of claim 1, further comprising:
an input sensing layer disposed between the encapsulation layer and the organic layer.

12. The display device of claim 1, wherein the light emitting element includes a first electrode, an emission layer, and a second electrode which are sequentially stacked,
wherein the display device further comprises a pixel defining layer covering an edge of the first electrode and defining an opening exposing a center of the first electrode, and
wherein the first light shielding layer overlaps the pixel defining layer in the plan view.

13. The display device of claim 1, further comprising:
a planarization layer disposed on the first light shielding layer.

14. A display device, comprising:
a substrate;
a light emitting element disposed on the substrate;
an encapsulation layer disposed on the light emitting element;
an organic layer disposed on the encapsulation layer;
a first light shielding layer disposed on the organic layer; and
an inorganic layer disposed between the organic layer and the first light shielding layer, including a silicon compound, and including a first region and a second region, wherein the first region overlaps the first light shielding layer in a plan view, and a number of silicon dangling bonds in the second region is less than a number of silicon dangling bonds in the first region.

15. The display device of claim 14, wherein an atomic percentage of silicon in the first region is greater than an atomic percentage of silicon in the second region.

16. The display device of claim 14, wherein a refractive index of the first region is greater than a refractive index of the second region.

17. The display device of claim 14, wherein a width of the first region is greater than a width of the first light shielding layer.

18. A method of manufacturing a display device, the method comprising:
- forming a light emitting element on a substrate;
- forming an encapsulation layer on the light emitting element;
- forming an organic layer on the encapsulation layer;
- forming an inorganic layer on the organic layer;
- partially implanting ions into the inorganic layer to form a first region into which the ions are implanted; and
- forming a first light shielding layer on the inorganic layer, wherein the first light shielding layer overlaps the first region in a plan view.

19. The method of claim 18, wherein partially implanting the ions into the inorganic layer includes:
- forming a photoresist layer on the inorganic layer; and
- implanting the ions into the inorganic layer using the photoresist layer as a doping mask.

20. The method of claim 18, wherein partially implanting the ions into the inorganic layer includes:
- disposing a slit mask on the inorganic layer; and
- implanting the ions into the inorganic layer through the slit mask.

21. The method of claim 18, wherein partially implanting the ions into the inorganic layer is performed by one of an ion implantation method or an inductively coupled plasma method.

* * * * *